United States Patent [19]
Liu et al.

[11] Patent Number: 6,004,880
[45] Date of Patent: Dec. 21, 1999

[54] METHOD OF SINGLE STEP DAMASCENE PROCESS FOR DEPOSITION AND GLOBAL PLANARIZATION

[75] Inventors: Yauh-Ching Liu, Sunnyvale; Dung-Ching Perng, San Jose, both of Calif.

[73] Assignee: LSI Logic Corporation, Milpitas, Calif.

[21] Appl. No.: 09/027,307

[22] Filed: Feb. 20, 1998

[51] Int. Cl.$^6$ .................. H01L 21/288; H01L 21/302
[52] U.S. Cl. .................. 438/692; 438/693; 438/694; 438/695; 438/697; 438/759; 205/93; 205/157
[58] Field of Search .................. 438/692–695, 438/697, 759, 959; 216/89; 205/93, 157, 238, 239, 261, 291, 662, 663

[56] References Cited

U.S. PATENT DOCUMENTS

| | | | |
|---|---|---|---|
| 5,723,387 | 3/1998 | Chen | 438/692 |
| 6,807,165 | 9/1998 | Uzoh et al. | 451/41 |

OTHER PUBLICATIONS

Morand et al., "Copper Integration in Self Aligned Dual Damascene Architecture", 1997, Symposium on VLSI Technology Digest of Technical Papers, pp. 31–32.

Tsuchiya et al., "Ultra–Low Resistance Direct Contact Cu Via Technology Using In–Situ Chemical Vapor Cleaning", 1997, Symposium on VLSI Technology Digest of Technical Papers, pp. 59–60.

*Primary Examiner*—Benjamin Utech
*Assistant Examiner*—Donald L. Champagne
*Attorney, Agent, or Firm*—Beyer & Weaver LLP

[57] ABSTRACT

A modified chemical-mechanical polishing apparatus is described. The apparatus includes: (i) a polishing pad for providing a surface against which a surface of an integrated circuit substrate is polished during polishing; (ii) an anode on which the polishing pad is secured, the anode including an electrolyzable conductive material; and (iii) a voltage source including a first electrical connection and a second electrical connection, the first electrical connection being connected to the anode and the second electrical connection being configured for connection to the integrated circuit substrate undergoing polishing such that when a voltage is applied from the voltage source in the presence of slurry admixed with an electrolyte composition on the polishing pad, an electrolytic cell results in which the conductive material deposits on the surface of the integrated circuit substrate. A process of depositing a conductive material on and polishing a surface of an integrated circuit substrate simultaneously is also described.

14 Claims, 4 Drawing Sheets

METHOD OF SINGLE STEP DAMASCENE PROCESS FOR DEPOSITION AND GLOBAL PLANARIZATION

BACKGROUND OF THE INVENTION

The present invention relates to performing metal deposition and global planarization of an integrated circuit substrate (IC) surface simultaneously. More particularly, the present invention relates to employing a modified chemical-mechanical polishing (CMP) apparatus to simultaneously perform metal deposition during global planarization of an integrated circuit (IC) substrate surface that is being processed according to the damascene process.

The damascene process, well known in the art and explained hereinafter, provides a metallization inlaid dielectric layer as opposed to having a metallization layer patterned above a dielectric layer. FIGS. 1A–1C show a portion of a surface of a partially fabricated IC substrate 10 that is processed to form a metal line and a via plug in a dielectric layer.

FIG. 1A shows the surface of a partially fabricated IC 10 including a dielectric layer 14, which is disposed above a first metallization layer 12 and includes a trench 16 and a via hole 18. As shown in FIG. 1A, trench 16 and via hole 18 are connected to each other in dielectric layer 14. Stated another way, trench 16 is a concave region that recesses inwardly into a top surface of dielectric layer 14 and is superimposed on via hole 18, which is an aperture through dielectric layer 14.

Partially fabricated IC 10 shown in FIG. 1A is typically formed by developing on the top surface of dielectric layer 14 a via mask, according to conventional photolithography, and then etching dielectric layer 14 from the top surface to a bottom surface to form via hole 18. Next, another mask, a trench mask, is similarly developed on dielectric layer 14 and dielectric layer 14 is etched to form trench 16. Those skilled in the art will recognize that trench 16 of FIG. 1A may be constructed by etching into the dielectric layer 14 before via hole 18 is formed using the same techniques described above or using a hard mask, e.g., a silicon nitride mask.

Next, a metallization layer 20 is blanket deposited on partially the fabricated IC substrate surface, as shown in FIG. 1B, filling trench 16 and via hole 18 of FIG. 1A to form a metal line 16' and a via plug 18', respectively. The IC substrate surface then undergoes chemical-mechanical polishing (CMP) to remove the excess metallization layer 20 deposited above dielectric layer 14 and above metal line 16'. CMP typically involves mounting an IC substrate, e.g., a semiconductor wafer, faced down on a substrate holder and rotating the substrate surface against a polishing pad mounted on a platen, which is in turn rotating or is in orbital state. A slurry containing a chemical that chemically interacts with the facing substrate layer and an abrasive that physically removes that layer is flowed between the substrate surface and the polishing pad or on the pad near the substrate surface.

After CMP concludes, partially fabricated IC 10 is typically substantially planar and ready for another deposition of a dielectric layer. Those skilled in the art will recognize that similar steps of dielectric and metal layer depositions, followed by etching or CMP may be carried out on the surface of partially fabricated IC 10 to completely fabricate an IC.

Unfortunately, the current damascene process described above suffers from several drawbacks. By way of example, the current process requires two separate steps for metal deposition and polishing, which steps are expensive to implement. Furthermore, the current process is also time-consuming and therefore lowers the throughput for the semiconductor fabrication process.

What is therefore needed is a process of rapidly and inexpensively forming metal lines and plugs on an IC substrate surface.

SUMMARY OF THE INVENTION

To achieve the foregoing, the present invention provides a modified chemical-mechanical polishing apparatus. The apparatus includes: (i) a polishing pad for providing a surface against which a surface of an integrated circuit substrate is polished during polishing; (ii) an anode on which the polishing pad is secured, the anode including an electrolyzable conductive material; and (iii) a voltage source including a first electrical connection and a second electrical connection, the first electrical connection being connected to the anode and the second electrical connection being configured for connection to the integrated circuit substrate undergoing polishing such that when a voltage is applied from the voltage source in the presence of slurry admixed with an electrolyte composition on the polishing pad, an electrolytic cell results in which the conductive material deposits on the surface of the integrated circuit substrate.

The polishing pad may include at least one of felt, urethane, polyurethane, polyethylene and filler material. The integrated circuit substrate may be a semiconductor wafer having a surface that includes a dielectric layer having an aperture and a trench, the aperture provides an opening from a top surface to a bottom surface of the dielectric layer and the trench is a concave region that recesses inwardly into the top surface of the dielectric layer and is disposed above the aperture. The electrolyte composition may include $CuSO_4$ (copper sulfate). The anode includes at least one of copper, aluminum, tungsten, gold and silver. The anode may include one of a metallic disk or a metallic ring.

In one embodiment, the chemical-mechanical apparatus of the present invention further include a substrate holder for securing the integrated circuit substrate. In this embodiment, the second electrical connection is connected to the substrate holder that is electrically connected to the integrated circuit substrate.

In another aspect, the present invention provides a process of depositing a conductive material on and polishing a surface of an integrated circuit substrate simultaneously. The process includes: (i) providing the integrated circuit substrate surface on a polishing pad mounted on an anode including an electrolyzable conductive material; (ii) connecting a first electrical connection of a voltage source to the anode and connecting a second electrical connection of the voltage source to the integrated circuit substrate; (iii) introducing on the polishing pad slurry admixed with an electrolyte; and (iv) polishing the integrated circuit substrate surface while applying a voltage between the integrated circuit substrate and the anode such that the conductive material is deposited on the integrated circuit substrate surface.

The anode may include at least one metal and is mounted on a supporting body. The supporting body may be a platen. In the process of the present invention, the integrated circuit substrate is a semiconductor wafer having a surface that includes a dielectric layer having an aperture and a trench, the aperture provides an opening from a top surface to a bottom surface of the dielectric layer and the trench is a concave region that recesses inwardly into the top surface of the dielectric layer and is disposed above the aperture and in the step of applying voltage, the conductive material is deposited in the aperture and the trench.

The aperture in the IC substrate may have a depth that is between about 500 Angstroms and about 3 μm. The aperture may have a width that is between about 250 Angstroms and about 1 μm. The trench in the IC substrate surface may have a depth that is between about 500 Angstroms and about 2 μm. A width of the trench may be between about 500 Angstroms and about 1 μm and is preferably between about 500 Angstroms and about 0.25 μm.

A metallization layer may be disposed below the dielectric layer. In the process of the present invention, the step of connecting the second electrical connection to the integrated circuit substrate includes securing the integrated circuit substrate on a substrate holder that is electrically connected to the second electrical connection.

The anode may be one of metallic disk or metallic ring. In the step of applying, the voltage may be sufficiently high to deposit a thickness of the conductive material on the integrated circuit substrate surface and in the polishing, a pressure exerted by the integrated circuit substrate on the polishing pad is sufficiently high to remove the conductive material of the thickness from the integrated circuit substrate surface.

The present invention represents a marked improvement over the current damascene process. By way of example, the deposition and polishing steps currently performed in multiple steps are performed by the present invention in a single step. This makes the process of the present invention much faster than the current damascene process. Additionally, the inventive processes can be easily implemented by making minor modifications to a conventional CMP apparatus. Thus, it is relatively inexpensive to implement the inventive processes.

As another example, the deposition of a conductive material or metal accomplished by the present invention is more conformal relative to the deposition accomplished by the current methods. The metal plugs and lines formed by the present invention are substantially free of any voids or seams. Thus, the present invention provides metal plugs and lines that ensure a solid contact between the various IC features.

These and other features of the present invention will be described in more detail below in the detailed description of the invention and in conjunction with the following figures.

DETAILED DESCRIPTION OF THE PREFERRED EMBODIMENTS

The present invention employs a modified chemical-mechanical polishing (CMP) apparatus to polish and deposit a conductive material on an integrated circuit (IC) substrate surface simultaneously. In the following description, numerous specific details are set forth in order to fully illustrate a preferred embodiment of the present invention. It will be apparent, however, that the present invention may be practiced without limitation to some specific details presented herein. By way of example, the present invention describes the formation of metal plugs in terms of forming a via plug that connects two metallization layers in an integrated circuit (IC). Those skilled in the art will recognize, however, that a contact plug may be similarly formed, except the contact plug connects a metallization layer and a transistor device's diffusion region, e.g., source, drain or gate electrode.

Figure 2:
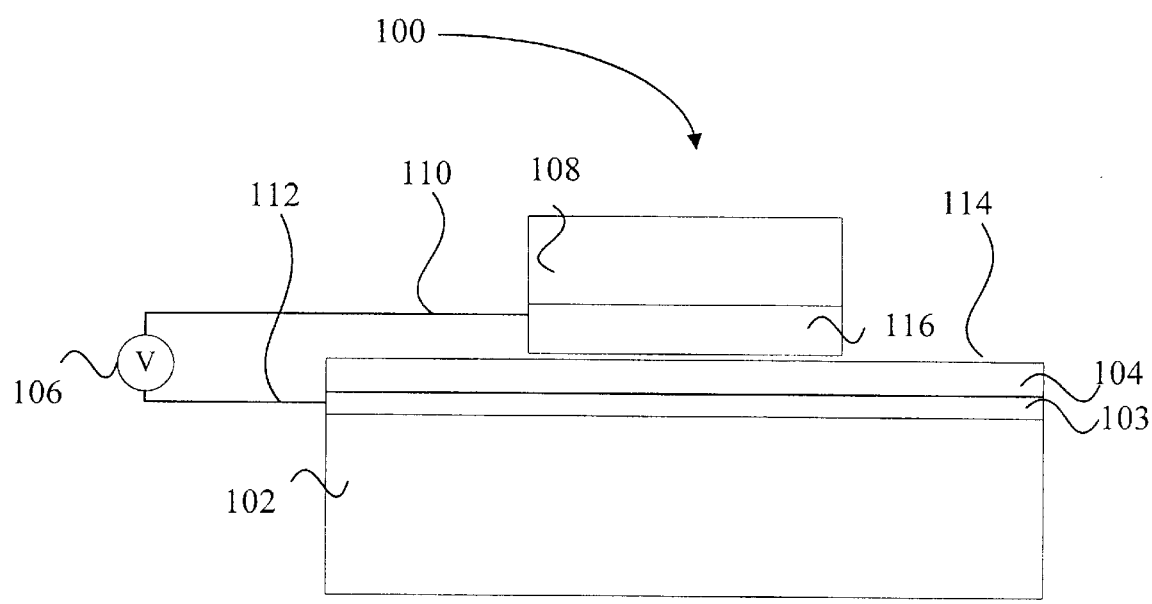
FIG. 2 shows some significant components in a modified chemical-mechanical polishing apparatus, according to one embodiment of the present invention.

FIG. 2 shows some significant components of a modified chemical-mechanical polishing (CMP) apparatus 100, according to one embodiment of the present invention. CMP apparatus 100 includes a polishing pad 104 that is mounted on an anode, which is in turn supported on a supporting body 102. A substrate holder 108 secures an integrated circuit (IC) substrate 116 that is polished on polishing pad 104. A voltage source 106 has a first electrical connection 112 that is connected to anode 103 and a second electrical connection 110 that is connected to IC substrate 116. During polishing, slurry 114 including an electrolyte composition is introduced on polishing pad 104.

The configuration of components of CMP apparatus 100 described above and shown in FIG. 2 is intended only as an example of how a CMP apparatus can be modified to form an electrolytic cell and those skilled in the art will recognize that these components may be arranged in other ways to achieve the same result. By way of example, second electrical connection 110 is electrically connected to substrate holder 108, which is in turn electrically connected to IC substrate 116.

Polishing pad 104 generally includes at least one of urethane, polyurethane, polyethylene and a filler material. Anode 103 includes an electrolyzable conductive material and may be shaped to facilitate uniform electrolytic deposition on the integrated circuit substrate surface. Anode 103 serves as a source for such metal ions as copper ions, aluminum ions, tungsten ions, gold ions and silver ions and preferably serves as a source for copper ions. Anode 103 is preferably a disk or ring shaped object.

In a CMP apparatus such as the Avanti 472, which is commercially available from Integrated Processing Equipment Corporation (IPEC) of Phoenix, Ariz., supporting body 102 is a platen disposed below polishing pad 104. Substrate holder 108 is typically made from stainless steel and may be in communication with a pressurizing mechanism that applies a down force or pressure on IC substrate 116 against polishing pad 104 during CMP. In another CMP apparatus such as the AvantGaard 676, also available from Integrated Processing Equipment Corporation (IPEC) of Phoenix, Ariz., however, the requisite pressure on IC substrate 116 is applied from a pressurizing mechanism disposed below the polishing pad. Voltage source 106 may include an AC or a DC power source that can generate an appropriate voltage bias for facilitating electrolytic deposition.

The electrolyte composition in slurry 114 should be such that transport of a conductive material or metal ion is facilitated from anode 103 to surface of IC substrate 116, where the conductive material or metal is ultimately deposited. In one embodiment of the present invention, the electrolyte composition that is employed when depositing copper is $CuSO_4$ (copper sulfate). In a preferred embodiment, the electrolyte composition employed in the present invention includes a material that does not react with the other slurry components, rather it performs the function of a slurry component, e.g., the electrolyte composition acts as an oxidizing agent and reacts with the exposed IC metal layer or the electrolyte composition serves as the abrasive particles that physically remove the metal deposition during polishing.

Figure 1A:
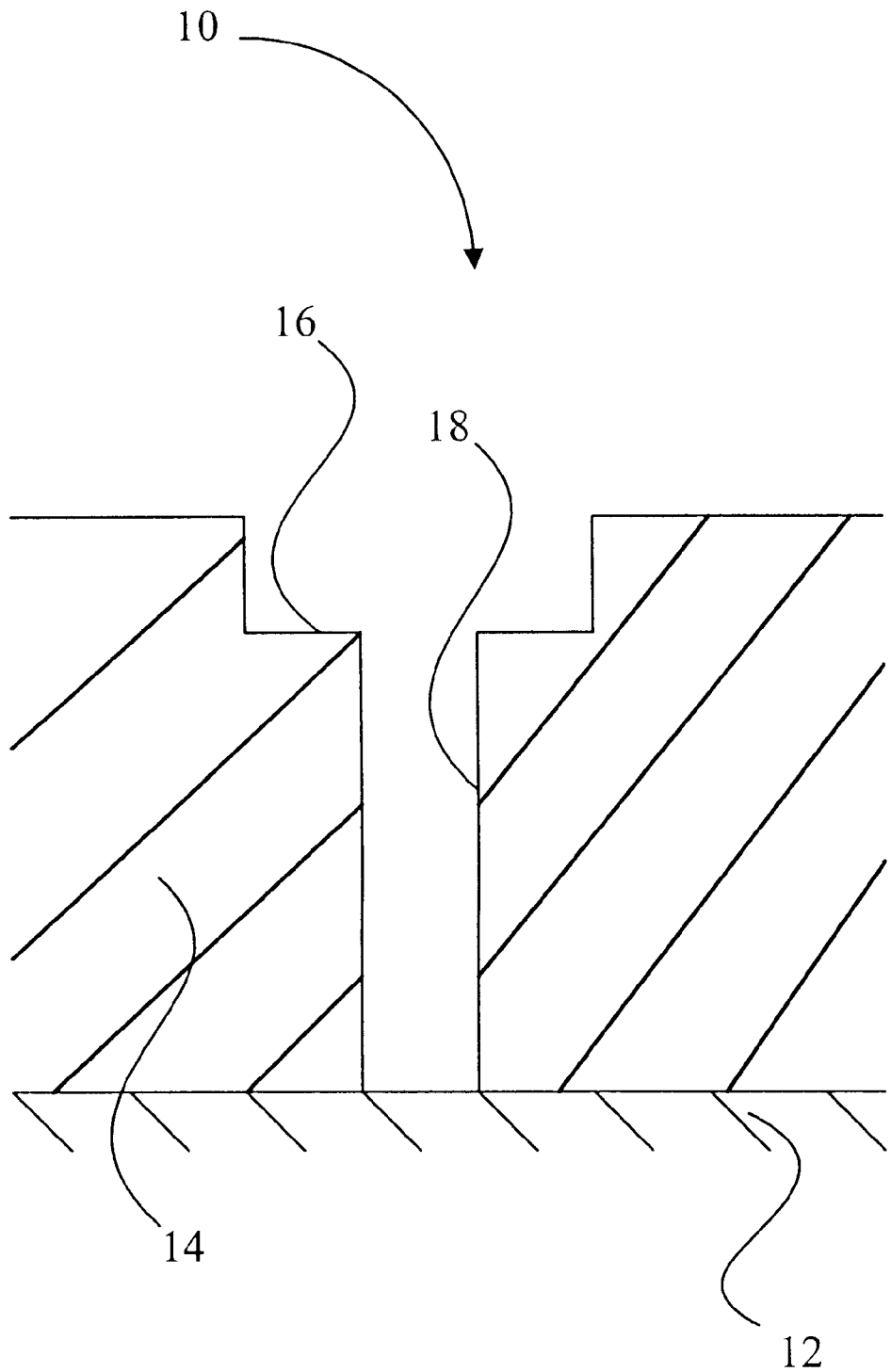
FIGS. 1A, 1B and 1C show a cross-sectional view of a partially fabricated integrated circuit substrate being processed according to the damascene process to form a metal line and a via plug.

A single polishing and deposition process, according to one embodiment of the present invention, is described below. Those skilled in the art will recognize that the steps described-below can be carried out in different sequences. The single polishing and deposition process may begin when a partially fabricated IC like the one shown in FIG. 1A is obtained.

The via hole in the IC substrate obtained in this step has a depth (measured from a top surface to the bottom surface of the dielectric layer) that generally ranges from about 500 Angstroms to an upper limit, which depends on whether the IC is employed to perform memory or logic functions. The upper limit is preferably as high as about 3 $\mu$m.

The trench of the IC substrate has a depth that is between about 500 Angstroms and about 2 $\mu$m. The width of the trench and via hole depend on the generation of the IC and the level of metallization, e.g., whether the via hole and trench are formed in the first dielectric layer or the fourth dielectric layer. In a preferred embodiment, however, the width of the via hole is between about 250 Angstroms and about 1 $\mu$m. The width of the trench is preferably between about 500 Angstroms and about 1 $\mu$m and more preferably between about 500 Angstroms and about 0.25 $\mu$m.

The IC substrate is then secured on a substrate holder and an electrical connection between the IC substrate and a second electrical connection of a voltage source is established. By way of example, this may be accomplished by connecting the second electrical connection directly to the IC substrate or alternatively by connecting the second electrode to the IC substrate through the substrate holder, which secures the IC substrate. An electrical connection between the anode and a first electrical connection of the voltage source is also established.

In order to facilitate film removal from the IC substrate surface, slurry including an electrolyte containing metal is introduced on the polishing pad surface and polishing commences as described above. In a preferred embodiment of the present invention, however, the polishing pad is saturated with slurry.

During polishing, the voltage source is activated and an electrolytic cell results such that the voltage difference between the anode and the IC substrate surface facilitates the deposition of the metal composition from the anode to the IC substrate surface. In the IC substrate shown in FIG. 1A, for example, the electrolytic deposition fills the via hole and the trench with metal to form a via plug and a metal line, respectively. The voltage applied by the voltage source can be adjusted to vary the electrolytic deposition rate on the IC substrate surface.

Figure 1B:
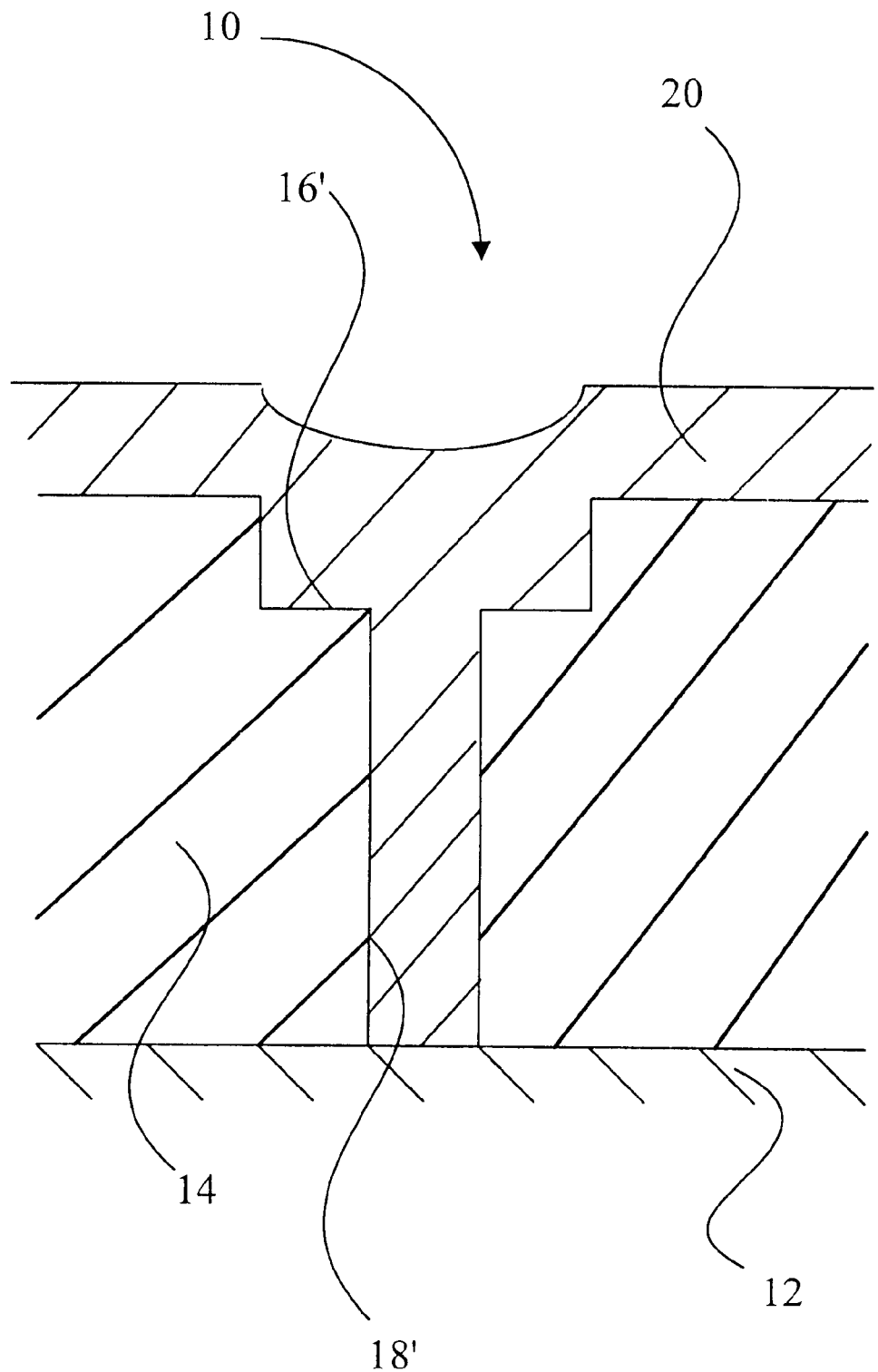
Figure 1C:
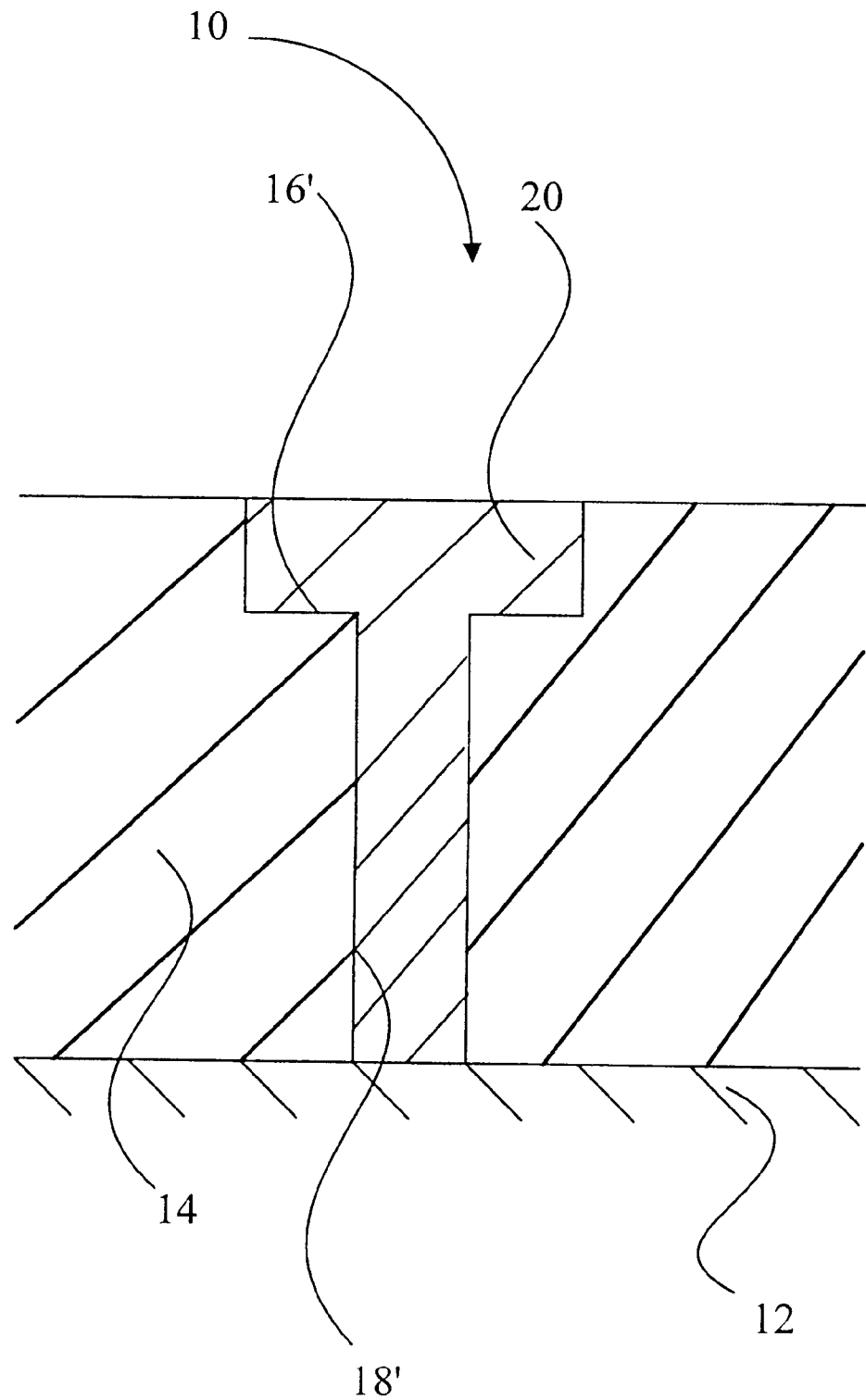

Furthermore, during polishing, pressure is applied on the IC substrate to facilitate film removal from the IC substrate surface. The requisite pressure may be applied on the IC substrate from a pressurizing mechanism that is in communication with the substrate holder and disposed above the IC substrate or may be applied by a pressurizing mechanism disposed below the polishing pad and IC substrate. Regardless of how the pressure is applied on the IC substrate surface, those skilled in the art will recognize that this pressure may be adjusted to vary the film removal rate or metal layer removal rate when the partially fabricated IC substrate of FIG. 1B is undergoing polishing.

In a preferred embodiment of the present invention, the settings of the voltage source and the pressurizing mechanism are balanced such that the electrolytic deposition rate is substantially equal to the film removal rate. In other words, if an electrolytic deposition of a certain thickness takes place on the dielectric layer (excluding the deposition in the via hole or trench) at a certain setting of the voltage source, then sufficient pressure is applied by the pressurizing mechanism on the IC substrate so that the electrolytic deposition of the same thickness is removed simultaneously or almost at the same time from the dielectric layer surface. In this embodiment, the via hole and trench in the dielectric layer are filled with the electrolyte composition of the slurry, without any electrolytic deposition above the dielectric surface where there is no concave regions on the dielectric layer surface. Thus, the via hole and trench of the IC substrate are filled with the electrolyte and surface of the IC substrate is planarized simultaneously.

The present invention represents a marked improvement over the current damascene process. By way of example, the deposition and polishing steps currently performed in multiple steps are performed by the present invention in a single step. This makes the process of the present invention much faster than the current damascene process. Additionally, the inventive processes can be easily implemented by making minor modifications to a conventional CMP apparatus. Thus, it is relatively inexpensive to implement the inventive processes.

As another example, the deposition of a conductive material or metal accomplished by the present invention is more conformal relative to the deposition accomplished by the current methods. The metal plugs and lines formed by the present invention are substantially free of any voids or seams. Thus, the present invention provides metal plugs and lines that ensure a solid contact between the various IC features.

Although the foregoing invention has been described in some detail for purposes of clarity of understanding, it will be apparent that certain changes and modifications may be practiced within the scope of the appended claims. For example, while the specification describes forming metal plugs and lines in an IC substrate, there is no reason why in principle other conductive structures of an IC cannot be formed similarly. Therefore, the present embodiments are to be considered as illustrative and not restrictive, and the invention is not to be limited to the details given herein, but may be modified within the scope of the appended claims.

What is claimed is:

1. A process of depositing a conductive material on and polishing a surface of an integrated circuit substrate simultaneously, comprising:

providing said integrated circuit substrate surface on a polishing pad mounted on an anode including an electrolyzable conductive material;

connecting a first electrical connection of a voltage source to said anode and connecting a second electrical connection of said voltage source to said integrated circuit substrate;

introducing on said polishing pad slurry admixed with an electrolyte; and polishing the integrated circuit substrate surface while applying a voltage between said integrated circuit substrate and said anode such that said conductive material is deposited on the integrated circuit substrate surface.

2. The process of claim 1, wherein said anode includes at least one metal.

3. The process of claim 1, wherein said anode is mounted on a supporting body.

4. The process of claim 3, wherein said supporting body is a platen.

5. The process of claim 1, wherein:

said integrated circuit substrate is a semiconductor wafer having a surface that includes a dielectric layer having an aperture and a trench, said aperture provides an opening from a top surface to a bottom surface of said dielectric layer and said trench is a concave region that recesses inwardly into said top surface of said dielectric layer and is disposed above said aperture;

and in said applying voltage said conductive material is deposited in said aperture and said trench.

6. The process of claim 5, wherein said aperture has a depth that is between about 500 Angstroms and about 3 $\mu$m.

7. The process of claim 5, wherein said aperture has a width that is between about 250 Angstroms and about 1 $\mu$m.

8. The process of claim 5, wherein said trench has a depth that is between about 500 Angstroms and about 2 $\mu$m.

9. The process of claim 5, wherein said trench has a width that is between about 500 Angstroms and about 1 $\mu$m.

10. The process of claim 9, wherein said width is between about 500 Angstroms and about 0.25 $\mu$m.

11. The process of claim 5, wherein a metallization layer is disposed below said dielectric layer.

12. The process of claim 5, wherein said connecting said second electrical connection to said integrated circuit substrate includes securing said integrated circuit substrate on a substrate holder that is electrically connected to said second electrical connection.

13. The process of claim 1, wherein said anode is one of metallic disk or metallic ring.

14. The process of claim 1, wherein in said applying, said voltage is sufficiently high to deposit a thickness of said conductive material on the integrated circuit substrate surface and in said polishing, a pressure exerted by the integrated circuit substrate on the polishing pad is sufficiently high to remove said conductive material of said thickness from said integrated circuit substrate surface.

* * * * *